United States Patent
Zeller

(10) Patent No.: US 11,899,087 B2
(45) Date of Patent: Feb. 13, 2024

(54) COMPUTER-IMPLEMENTED METHOD FOR EVALUATING MAGNETIC RESONANCE DATA, MAGNETIC RESONANCE DEVICE, COMPUTER PROGRAM, AND ELECTRONICALLY READABLE DATA MEDIUM

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 38 days.

(21) Appl. No.: 17/534,786

(22) Filed: Nov. 24, 2021

(65) Prior Publication Data

US 2022/0171008 A1    Jun. 2, 2022

(30) Foreign Application Priority Data

Nov. 30, 2020    (DE) .......................... 102020215031.1

(51) Int. Cl.
*G01R 33/56*      (2006.01)
*G06T 3/40*        (2006.01)
*G06T 5/00*        (2006.01)

(52) U.S. Cl.
CPC ............ *G01R 33/5608* (2013.01); *G06T 3/40* (2013.01); *G06T 5/002* (2013.01);
(Continued)

(58) Field of Classification Search
None
See application file for complete search history.

(56) References Cited

U.S. PATENT DOCUMENTS

| | | | |
|---|---|---|---|
| 2014/0350386 A1 | 11/2014 | Eggers et al. | |
| 2017/0082713 A1* | 3/2017 | Fenchel | ............ G01R 33/5608 |
| 2022/0196769 A1* | 6/2022 | Sommer | ............ G01R 33/5608 |

FOREIGN PATENT DOCUMENTS

| | | |
|---|---|---|
| DE | 102015218168 A1 | 3/2017 |
| EP | 2610632 A1 | 7/2013 |

OTHER PUBLICATIONS

Dar et al. Transfer-Learning Approach for Accelerated MRI Using Deep Neural Networks, (Year: 2020).*
(Continued)

*Primary Examiner* — Douglas X Rodriguez
(74) *Attorney, Agent, or Firm* — Banner & Witcoff Ltd.

(57) ABSTRACT

A computer-implemented method is described for evaluating magnetic resonance data of a scan region of a patient acquired by means of a magnetic resonance device, wherein, following acquisition of at least two image datasets using an acquisition technique at different echo times in each case, by combination of the image datasets, at least two combination datasets, each showing magnetic resonance signals of a different spin species, are determined, wherein, in order to assign a spin species shown in the combination dataset to each combination dataset, an input dataset is determined from the combination datasets, and the input dataset is evaluated by means of an assignment algorithm which comprises a trained function and which determines assignment information assigning to each combination dataset the spin species shown therein, wherein a pre-trained function trained further with regard to the spin species assignment by means of transfer learning is used as the trained function.

20 Claims, 6 Drawing Sheets

(52) U.S. Cl.
CPC ............... *G06T 2207/10088* (2013.01); *G06T 2207/20081* (2013.01); *G06T 2207/20084* (2013.01)

(56) References Cited

OTHER PUBLICATIONS

Krizhevsky, Alex et al. "ImageNet classification with deep convolutional neural networks", Advances in neural information processing systems, p. 1097 ff., 2012.

Simonyan, Karen, and Zisserman, Andrew "Very Deep Convolutional Networks for Large-Scale Image Recognition" https://arxiv.org/abs/1409.1556v6 (2014); 2014.

Kaiming He, Xiangyu Zhang, Shaoqing Ren, Jian Sun. Deep Residual Learning for Image Recognition. CoRR, 2015.; 2015.

Dar, Salman UL Hassan et al.: ": Transfer-Learning Approach for Accelerated MRI Using Deep Neural Networks"; Magnetic Resonance in Medicine 2020; vol. 84, pp. 663-685.

Napoletano P., Anomaly Detection in NanoFibrous Materials by CNN-Based Self-Similarity, Jan. 2018, ResNet-18 Architecture Download Table (Aug. 6, 2020).

\* cited by examiner

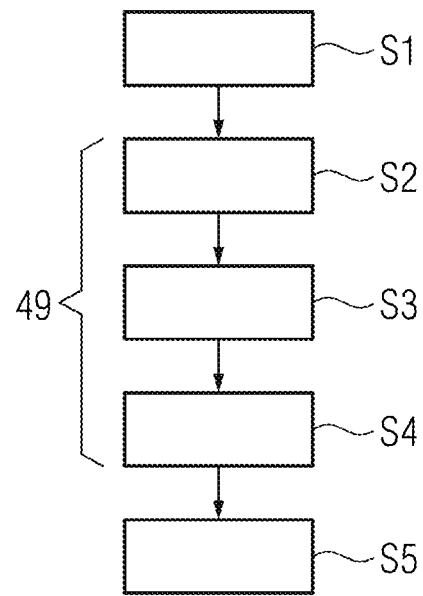
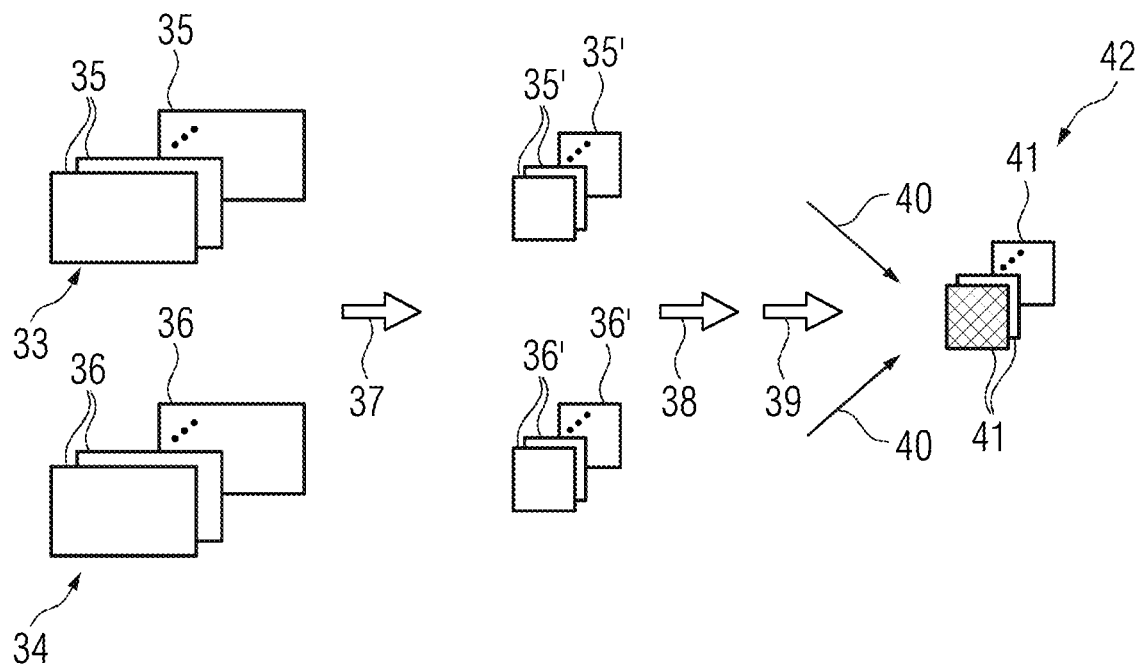

COMPUTER-IMPLEMENTED METHOD FOR EVALUATING MAGNETIC RESONANCE DATA, MAGNETIC RESONANCE DEVICE, COMPUTER PROGRAM, AND ELECTRONICALLY READABLE DATA MEDIUM

CROSS-REFERENCE TO RELATED APPLICATIONS

The present application claims the benefit of the filing date of Germany patent application no. DE 10 2020 215 031.1, filed on Nov. 30, 2020, the contents of which are incorporated herein by reference in their entirety.

TECHNICAL FIELD

The disclosure relates to a computer-implemented method for evaluating magnetic resonance data of a scan region of interest of a patient that has been acquired by means of a magnetic resonance device wherein, following acquisition of at least two image datasets using an acquisition technique at different echo times in each case, by combination of the image datasets, at least two combination datasets, each showing magnetic resonance signals of a different spin species, are determined, wherein, in order to assign a spin species shown in the combination dataset to each combination dataset, an input dataset is determined from the combination datasets, and the input dataset is evaluated by means of an assignment algorithm which comprises a trained function and which determines assignment information assigning to each combination dataset the spin species shown therein.

The disclosure further relates to a magnetic resonance device, a computer program, and an electronically-readable data medium.

BACKGROUND

In magnetic resonance imaging, it may happen that different spin species have slightly different Larmor frequencies, which can lead to phase differences during the imaging. An example of this are the differences between spins of protons bound to water (water spins) and the spins of protons bound to fat (fat spins) as spin species. In many imaging modalities it is desirable to suppress either spin species or even to label the corresponding spin species, i.e. to generate only the water images showing the magnetic resonance signal of the water spins and/or only the fat images showing the magnetic resonance signal of the fat spins. A well-known approach to achieve this is the Dixon method, which can be applied to spin species having Larmor frequencies shifted with respect to one another (which is also referred to as chemical shift), in particular to water spins and fat spins. The underlying idea here is to acquire two image datasets as magnetic resonance data at different echo times, optimally in such a way that the first image dataset shows the scan region with fat and water signals in phase at the k-space center, and the second image dataset is acquired in such a way that the fat and water signals are out of phase, in particular are oppositely oriented ("opposed phase"). In this case, with this optimal assumption, the image datasets are also referred to as in-phase image and out-of-phase image, from which, by simple combination, in particular by subtraction or addition, fat images and water images can be derived if the out-of-phase image is what is termed an "opposed phase image", in which, as described, the phase difference amounts to $\pi$.

In practice, however, problems occur when the Dixon method is applied. For example, the described optimal process flow of the Dixon method is based on the premise of a perfect basic field homogeneity (BO homogeneity). Furthermore, local susceptibility effects and/or eddy current effects are not taken into account, with the result that approaches have been proposed which are intended to correct for these effects and nonetheless determine unambiguous combination datasets, in each case showing the magnetic resonance signals of one spin species, from the image datasets. This means more complex combination algorithms, in particular Dixon algorithms, are employed to determine interference effects, in particular the actual background phase, and to achieve a separation of the contributions of the different spin species.

With two spin species, in particular fat spins and water spins, the combination algorithm therefore supplies two images as combination datasets, although owing to the performed corrections and effects it is not always possible to make a correct assignment of the combination datasets to the spin species. In other words, although combination datasets are obtained which in each case contain only the fractions of one spin species, it is not known which image, in the case of fat spins and water spins, is the fat image and which is the water image.

However, it is essential for a diagnostic evaluation to assign the resulting combination datasets correctly, in particular since in many cases the fat image is also discarded entirely if only a perfectly fat-saturated water image is required for the evaluation and for the diagnosis. Moreover, automatic post-processing methods exist which require a correct characterization of the combination datasets, e.g. post-processing algorithms for automatic fat quantification or merge algorithms.

SUMMARY

Various approaches have already been proposed to estimate or determine which combination dataset belongs to which spin type. For example, it has been proposed to identify the combination dataset having the image element, in particular the voxel, with the highest intensity as the fat image since fat is represented as extremely bright in many types of magnetic resonance sequences. Another possibility is to determine a histogram of the image element values (voxel intensities) in both combination datasets, the histogram having the narrowest main peak being assigned to the fat image since the image element value distribution of fat tissue is typically much more localized in the histogram than that of water tissue. Nevertheless, labeling by means of these approaches is often unsuccessful, which occurs for example if the actual water image contains image elements having higher intensity than the fat image, in particular in the case of magnetic resonance signals from blood vessels and/or the bladder, or if there are no significant differences in the histogram widths. This leads to what are termed global fat-water swaps, which means fat images are labeled as water and vice versa.

DE 10 2015 218 168 A1 relates to a method for assigning a spin species (spin type) to a combination image. Therein it is proposed to load principles determined from existing data resources that relate to the assignment of spin species to combination images, and to assign the spin species represented in the at least one combination image on the basis of the loaded principles. The principles can be generated by means of machine-learning methods.

In order to perform the Dixon method using a turbo spin-echo sequence (TSE-Dixon), it has been proposed to carry out the assignment by way of a support vector machine (SVM). In this case different SVMs are used for 1.5-tesla and 3-tesla magnetic resonance devices, which SVMs are based only on a few handmade features, and have been trained for example on the basis of about 100 to 1000 datasets of volunteers. If other basic field strengths were to be supported, additional SVMs would be necessary.

Previously, a deep learning approach has also been proposed for the assignment step of a Dixon method using the VIBE sequence (VIBE-Dixon). The VIBE sequence is a spoiled three-dimensional gradient echo sequence (GRE sequence). In this known approach, an assignment algorithm was used which comprises a LeNet convolutional neural network (CNN) architecture. Here, a small section from the combination dataset that is to be assigned is used as the input dataset, for example 96×96 image elements in size, a single regression value between zero and one being obtained as output data and indicating the probability whether the current combination dataset is a fat image or a water image. For inference purposes, a random section is extracted from each slice image and fed into the LeNet, the regression values for the fat and water slice stacks being averaged at the end and a majority vote being taken to obtain the definitive assignment. This solution is well suited for combination datasets from the VIBE-Dixon method, though there is a large amount of training overhead. In fact, over a million random extracts from combination datasets of around 1000 volunteers were used for training the LeNet. If an attempt is made to apply this approach to the TSE-Dixon method, a clear degradation in assignment performance occurs. The volume of necessary training data due to the network architecture makes the possibility of training for an individual assignment algorithm for TSE-Dixon more difficult.

The object underlying the disclosure is therefore to disclose a possibility for assigning combination datasets to spin species that is improved by comparison therewith, e.g. using an artificial intelligence approach that makes do with far less input data, is suitable for a number of application cases, and delivers an improvement in assignment performance.

This object is achieved according to the disclosure by means of a method, a magnetic resonance device, a computer program, and an electronically readable data medium according to the specification including the claims.

In a method of the type cited in the introduction, it is therefore provided according to the disclosure that a pre-trained function, trained further with regard to the spin species assignment by means of transfer learning, is used as the trained function.

The disclosure is based on an acquisition technique, e.g. a multi-contrast acquisition technique in which at least two image datasets of a patient are determined as magnetic resonance data, each image dataset having been acquired at a different echo time, from which combination datasets are determined by combination of the image datasets, e.g. by a calculation sequence image element by image element via a combination algorithm, each combination dataset showing magnetic resonance signals of a particular spin species exclusively, the spin species of the combination datasets being different from one another. It can e.g. be provided in this case that the spin species are spins of fat-bound protons and spins of water-bound protons, i.e. one of the combination datasets is a water image, the other a fat image. Accordingly, the combination algorithm may be a Dixon algorithm as is generally known.

For instance, the same magnetic resonance sequence may be used to acquire the image datasets, with only the readout time window being shifted for the different image datasets. The magnetic resonance sequence may be a turbo spin-echo sequence (TSE sequence) so that e.g. a TSE-Dixon method is applied. Furthermore, the magnetic resonance sequence may also be a spin-echo sequence (SE sequence), a VIBE sequence and/or a HASTE sequence, etc. Corresponding Dixon techniques are referred to as SE-Dixon, VIBE-Dixon, and HASTE-Dixon, respectively.

Generally speaking, to determine the combination datasets, a Dixon algorithm that is embodied (i.e. implemented) to take account of deviations from assumed phase relationships between the spin species occurring due to interference effects during acquisition of the image datasets may be used as the combination algorithm. As explained above, the correction functionality that estimates and takes account of the actual phase relationships may lead to a situation where combination datasets cannot be correctly assigned to their spin species by the combination algorithm, in this case the Dixon algorithm. It should be noted in this connection that in principle it is also conceivable within the scope of the present disclosure to determine only one combination dataset and evaluate this accordingly by means of the assignment algorithm, though this is less preferred because this could lead to an unwanted combination dataset.

The combination datasets are in this case e.g. determined as slice image stacks, the slices of which correspond to the slices of the image datasets, which therefore can also be provided as a slice image stack. Therefore, e.g. mutually corresponding slice images exist in both combination datasets.

According to the present disclosure, the use of a special trained function in the assignment algorithm is proposed, specifically a pre-trained function that has been trained further with regard to the spin species assignment by means of transfer learning. This provides a novel deep learning approach for assignment steps, e.g. when the Dixon method is used. The basic idea of transfer learning is known. This entails firstly selecting a pre-trained function that has been trained for a related problem, and then retraining the same by transfer learning to address the problem that is actually to be solved, with the result that a much smaller volume of training data is necessary nonetheless to achieve excellent performance. In this regard, it has been demonstrated within the scope of the present disclosure that pre-trained functions, e.g. pre-trained CNNs, as are known, can be used for general image processing problems, e.g. classification problems, and can be applied to the problem of spin species assignment with outstanding performance.

It has furthermore been shown particularly advantageously that a trained function of said type, even if it has been trained only for a specific strength of the basic field (B0 field), may be used for a plurality of further basic field strengths in magnetic resonance devices. In other words, it can be provided that the assignment algorithm comprising the trained function is applied for magnetic resonance devices having different basic field strengths, e.g. in the range from 0.5 to 3 tesla.

In development of the present disclosure, it can be provided that to determine the input data, the combination datasets are scaled down to a lower resolution, e.g. by more than 50%, by more than 80%, etc., and/or to a size of 48 to 256 by 48 to 256 per slice image, and may be square in shape. In other words, all the slice images of the combination datasets may be reduced to a smaller size, for example 112×112 image elements (pixels), with the result that the volume of input data for the trained function may be significantly reduced without the need to completely sacrifice image information from parts of the image, as was the case with the random excision of sections in the LeNet approach. In spite of this pre-processing simplification of the image information, it has been shown that it is possible to achieve even better results with excellent success rates. Moreover, the reduction in the volume of input data also permits a further reduction in the transfer learning training overhead. Advantageously, rescaling to a square grid is effected in this case, though approaches to retain the aspect ratio are also conceivable, in which event zero-filled areas can then be added to maintain the typically square structure of input data for the trained function. In this case, the size to which the slice images are reduced may be suitably chosen with the aid of the input layer of the trained function. Another approach to maintain the aspect ratio may also be to stamp a square area out of the downscaled slice image, e.g. to cut off surplus rows/columns on the longer side.

It should also be noted at this juncture that the downscaling within the scope of the present disclosure, as also described, relates to the dimension in the slice image plane; the number of slice images in the slice image stack is beneficially not changed since, as will be explained later, the trained function is applied in any case to individual slice images or corresponding slice images of the different combination datasets.

Beneficially, to determine the input data, the e.g. downscaled, combination datasets may be normalized to exploit the entire possible dynamic range for image element values. In conventional magnetic resonance devices, the permitted dynamic of image element values ranges from zero to 4095 or 65535, other maxima also being conceivable depending on processing state and format. Experience has shown that this maximum possible dynamic range is not fully utilized by the image datasets, and consequently also the combination datasets. Extending to the full dynamic range for image element values, i.e. pixel values in the case of slice images, accentuates contrasts and, as has been shown, provides better interpretability and feature extraction by means of the trained function. In this case, the normalization may e.g. take place at least with regard to the maximum image element value, e.g. pixel value in the case of slice images, or voxel value generally, which means the maximum image element value is set in the above-cited example to 4096 or 65535, generally to the maximum conceivable value from the dynamic range viewpoint, and the remainder of the image element values are co-scaled accordingly.

In this connection, it has been shown that an advantageous embodiment of the present disclosure is realized when the normalization is performed independently for each slice and each combination dataset. This means the individual slice images and the individual combination datasets are dealt with separately from one another, and thereafter utilize in each case the entire possible dynamic for image element values. In this way, an optimal dynamic expansion and, consequently, also an improvement in interpretability, is ultimately achieved, which has also been revealed in the results. In other exemplary embodiments, however, it is of course also conceivable that the normalization is based on the entire slice stack, either per combination dataset or for all combination datasets collectively.

A particularly advantageous development of the present disclosure provides that to determine the input data, slice images of the combination datasets showing the same slice, e.g. downscaled slice images, are consolidated to form a multichannel input data image. In practice, RGB channels may be used as channels in this case. In other words, RGB images may be generated as input data images by filling the different color channels (red, green, blue) as far as possible with slice images, e.g. downscaled slice images, of the combination datasets showing the same slice. In one example, it may be provided that slice images of the first combination dataset are placed into the red color channel, and slice images of the second combination dataset into the green color channel, while the blue color channel can be left empty or discarded. However, it is also conceivable that, given a number of channels greater than the number of combination datasets, at least one of the channels not used by an individual slice image is used for a combination image formed from the slice images, e.g. by linear combination. For example, a linear transformation of slice images of different combination datasets showing the same slice can therefore be performed, for example an addition or a subtraction, to insert this result into the third channel, which extends the learning base and later the evaluation base.

In this connection, it can further be provided that to increase the accuracy of the assignment information, the trained function may additionally be applied also to input data in which the assignment of the individual combination datasets to the channels is transposed, all the results of the trained function being incorporated into the assignment information. It has therefore been shown that as a result of such an artificial enlargement of the input database, altogether more accurate predictions with regard to the assignment to spin species can be made. However, this is not absolutely necessary, since it has been shown that excellent results are also obtained when only a single such input data image is used.

In a development of the present disclosure, it can be provided that when the input data is compiled, at least some of the combination data, e.g. slice images, showing e.g. at least mainly noise and/or a low intensity, are separated out by sorting on the basis of a filter criterion. This means an advantageous embodiment of the disclosure is produced when slice images having low image intensity, i.e. low image element values, are separated out, since the application of the trained function to such slice images would reduce the degree of accuracy. Thus, if, for example, a slice image contains mainly noise, it transpires that in most cases a fifty-fifty decision in respect of the spin species results for such slice images, e.g. when a normalization in respect of the image element with the highest image element value takes place for this slice image. If such slice images, e.g. the entire slices, are separated out, not only is the accuracy of the assignment information improved, but the necessary computing power is also reduced.

In a real-world implementation of the filtering function, it may for example be provided that the filter criterion sorts and separates out slice images whose average and/or maximum image element value falls below a threshold value, the threshold value being chosen in particular as a function of the average or maximum image element value occurring in all the combination data of the combination datasets. The filtering may therefore be performed by thresholding based on average or maximum image element values in the entire slice stack, so that it may be provided for example that the average intensity, i.e. the average image element value, of a slice image should not lie below 10% of the average intensity of all the slice images of the slice stack. A similar approach may be taken with respect to maximum values. In conducted experiments, it was revealed that the evaluation values delivered, as output data by the trained function indicated extremely clearly in most cases, a particular spin species for non-noisy slice images, for example results close to zero or close to one occurred as evaluation value when using a regression value between zero and one. This shows that the filter criterion may be chosen overall in such a way that only a small number of slices and hence slice images remain, since considering a few slices and their slice images is sufficient to achieve assignment information of an adequate accuracy, while the inference speed is increased in addition.

Beneficially, the assignment algorithm may be part of a higher-ranking evaluation function comprising the already mentioned combination algorithm, e.g. Dixon algorithm. An evaluation function of said type therefore delivers the combination datasets directly with (correct) assignment.

Advantageously, it can be provided that the trained function is applied one slice at a time in the case of image datasets acquired as a slice image stack, the assignment information being determined from the results for the different slices, e.g. on the basis of a majority vote. In the interference step, using the trained function, output data of the trained function can therefore be obtained for each slice individually, in which case the final decision, which is reproduced by the assignment information, can then be made in particular based on a majority vote. In this way, the input data from the input dataset that is required for each instance of the trained function is further reduced, which simplifies its training and improves its robustness.

Summarizing these approaches, an advantageous embodiment of the present disclosure therefore provides that to determine the input dataset, the combination datasets present as a slice image stack are firstly processed in such a way that all the slice images of the individual combination datasets are reduced to a predefined small size, for example 112×112 image elements, e.g. in a squared format. Next, the intensity of the slice images of all the combination datasets is advantageously normalized individually, e.g. at least in respect of the greatest pixel value. RGB input images are subsequently generated in which, for each slice, slice images of different combination datasets are inserted into the different channels, for example the red and the green color channel. The last color channel can remain empty in the case of two combination datasets or else receive a linear combination of the slice images. These RGB input data images present for each slice are supplied to the trained function one-by-one and separately for each slice by the assignment algorithm, while at the same time, if an increase in the accuracy of the resulting assignment information is desired, further RGB input data images can also be generated with swapped channels. In this way, the amount of input data for the trained function is significantly reduced, which in turn greatly simplifies its training, while it should be noted that at the same time, in the case of combination datasets present for patients/volunteers in which the assignment is known, i.e. which are used as training data, significantly more individual training datasets can be generated for the trained function since at least one training dataset is present for each slice.

Thus, by means of the herein described preprocessing to determine the input dataset, which is split up into different sub-datasets as input data for the same trained function, not only is a significant reduction in training overhead brought about, in addition to the use of transfer learning, but excellent results are also achieved, since, of course, the output data for the different slices is again statistically merged into the assignment information, e.g. based on a majority vote, such that an outstanding level of accuracy overall is also produced. Furthermore, as well as the training load, the computing load is also reduced for the assignment algorithm as a result of the smaller dimensioned trained function. A great number of advantages are therefore produced as a result of these synergetically interacting features.

It should however be noted at this juncture that alternatively to the consideration of individual slices, e.g. in an input data image comprising multiple channels from multiple combination datasets, other approaches are of course also conceivable in principle within the scope of the present disclosure. Thus, it is possible for example that the trained function receives the entire slice stack at once as input data, instead of processing individual slices. Although this may increase the accuracy of the individual instance of the trained function since more information is provided, it also increases the training overhead because not only are more training steps required, but also fewer training datasets can be derived from the database that is present.

Generally, a trained function maps cognitive functions that are typically associated human beings and human brains. By training based on training data (machine learning), the trained function is able to adapt to new circumstances and to detect and extrapolate patterns.

Generally speaking, parameters of a trained function can be adapted by training. For instance, supervised learning, semi-supervised learning, unsupervised learning, reinforcement learning, and/or active learning are used. In addition, representation learning (also known as "feature learning") may also be used. For example, the parameters of the trained function can be adapted iteratively by means of multiple training steps.

A trained function may for example comprise a neural network, a support vector machine (SVM), a decision tree and/or a Bayes network, and/or the trained function may be based on k-means clustering, Q-learning, kinetic algorithms and/or assignment rules. For example, a neural network may be a deep neural network, a convolutional neural network (CNN), or a deep CNN. In addition, the neural network may be an adversarial network, a deep adversarial network, and/or a generative adversarial network (GAN).

Convolutional neural networks (CNNs) are provided as pre-trained functions in most cases such that, in a beneficial embodiment of the present disclosure, the trained function of the assignment algorithm may also comprise a convolutional neural network (CNN). While the latter may advantageously be a ResNet-18, it is also conceivable that the trained function comprises a ResNet-34 and/or a SqueezeNet and/or an AlexNet and/or a VGG network. In this regard, ResNet-18 has the advantage of providing a good tradeoff between accuracy and speed.

Generally, it can be said that CNNs, including those that are used as pre-trained functions, have a convolutional base for generating features from the input data, e.g. images, which may e.g. have convolutional layers and pooling layers. The convolutional base is then typically followed by a classifier which can contain one or more fully connected layers (FCCs). The main aim of the classifier is the classification of the input data based on the features extracted by means of the convolutional base. In other words, a feature extraction in the convolutional base is followed by a classification in the classifier to provide the output data. A ResNet, short for "Residual Network", is characterized in that deeper neural networks can be created by using what are termed "skip connections" or "shortcuts" in order to bypass layers. The numbers used to identify ResNets, i.e. for example 18, 34, and the like, designate layers, although the architecture is the same. Two main types of blocks exist in a ResNet, namely identity blocks, in which the input and output activation dimensions are the same, and convolutional blocks, in which the input and output activation dimensions are different. For example, to reduce the activation dimensions by a factor of two, a 1×1 convolution with an increment ("stride") of two may be called upon. ResNet-18, for example, comprises multiple convolutional blocks in the convolutional base, followed by the classifier. For further information on ResNet, reference should be made to the article by K. He et al., "Deep residual learning for image recognition", arXiv Preprint arXiv: 1512.03385, 2015, on AlexNet reference should be made to the article by A. Krizhevsky et al., "Imagenet classification with deep convolutional neural networks," Advances in neural information processing systems, pages 1097-1105, 2012, and on VGG networks reference should be made to the article by K. Simonyan and A. Zisserman, "Very deep convolutional networks for large-scale image recognition", arXiv Preprint arXiv: 1409.1556, 2014.

In order to be able to deploy the pre-trained function, e.g. the pre-trained CNN, within the scope of the assignment algorithm, the original classifier is removed for example and replaced by a new classifier trained by means of transfer learning. The classifier delivers output data containing information on the spin species assignment. A beneficial development of the present disclosure provides that, in the case of two spin species, the trained function yields a regression value lying between zero and one, where zero corresponds to an assignment of a first spin species to a defined one of the combination datasets, and one corresponds to an assignment of the second spin species to the defined one of the combination datasets. A corresponding classifier may then be constructed for example in such a way that it comprises two fully connected layers, in which case the second returns only one output value, namely the regression value. If, for example, input data images having multiple channels, e.g. RGB input data images, are used in the preferred embodiment, the regression value can relate to the probability of a specific spin species in the first channel. If, for example, a downscaled and/or normalized slice image of the first combination dataset is arranged in the first channel, e.g. the red color channel, zero for the regression value can mean that the first spin species, for example fat spins, is present in the red color channel, whereas one as the regression value can mean that the second spin species, e.g. water spins, is present in the red color channel.

In contrast to the LeNet implementation discussed in the introduction, which requires more than one million training steps, the proposed method, which is based on functions trained further by means of transfer learning, delivers excellent results even with only five thousand training slice images of 140 different datasets at a basic field strength of 1.5 tesla. A test run on 81 datasets of body regions that were to be rated as critical with the preceding SVM implementations, for example breast, head, and spine, and that contained 21 cases of global swapping reported by operators, was successful for every single one of these datasets. In this case, ResNet-18 was used with pre-processing steps of downscaling to 112×112, normalization in respect of the highest image element value, and generation of RGB input data images in order to determine the input dataset. In these experiments, it was also established that although the trained function was trained with 1.5-tesla training datasets, it was also eminently applicable to all other basic field strengths. By adding training data at basic field strengths of 0.55 tesla and 3-tesla, it was possible to achieve a further stabilization of the trained function.

According to the disclosure, a computer-implemented method for providing a trained function may also be considered for use as part of an assignment algorithm, wherein, from an input dataset determined from combination datasets, the assignment algorithm determines assignment information, assigning to each combination dataset a spin species shown therein, wherein the combination datasets in each case show magnetic resonance signals of a different spin species and were determined from at least two image datasets of a scan region of a patient that were acquired by means of an acquisition technique at different echo times in each case, by combination of the image datasets, wherein the trained function is embodied to use input data of the input dataset in order to determine output data that is used to determine the assignment information, which training method is characterized by the following steps:

providing training datasets, each of which comprises training input data and associated training output data describing the spin species assignment of the training input data, providing a pre-trained function, further training of at least one component of the pre-trained function, e.g. at least one last layer of the pre-trained function, using the training datasets for determining the trained function, and providing the trained function.

Such a method, which may also be referred to as a training method, is therefore a computer-implemented method for providing a trained function for use in a previously-described evaluation method according to the disclosure. Accordingly, all statements relating to the evaluation method may also be applied analogously to the statements relating to the training method, e.g. insofar as the pre-processing of the input data is concerned, which of course is also to be applied correspondingly to the training input data if the cited features are provided. For example, therefore a downscaling, normalization, and/or consolidation of a multi-channel input data image may be performed to determine the training input data, in which case a slice-by-slice consideration is furthermore possible, which means that each slice from combination datasets present as slice image stacks, for which the spin species assignment is known, delivers at least one training dataset. The pre-trained function that is to be trained further may preferably comprise a CNN, e.g. a ResNet or one of the other cited types of pre-trained CNNs available. The statements relating to the input data may also be applied analogously, such that e.g. a regression value is yielded as output data.

In an advantageous embodiment of the training method, the training input data may be determined from real magnetic resonance data acquired from a patient population (or volunteer population). At the same time, real cases in which global swaps of the spin species occurred with previous assignment algorithms or combination algorithms may be selectively drawn upon for the training data. For instance, training for the critical cases is also accomplished in this way.

In this connection, a beneficial development of the training method provides that for at least a portion of the magnetic resonance data, the combination datasets are subjected to an image transformation, e.g. mirroring and/or shearing and/or rotation and/or a change in contrast, to generate further training datasets. The transformations may in this case be applied to already pre-processed combination data, e.g. to the already discussed input data image, for example RGB input data image. This means the input data images may be transformed to generate additional training data, where transformations may for example comprise rotations, mirrorings, shearings, changes in contrast, and the like. In this connection, it is further conceivable that combination datasets assigned to different spin species are interchanged, e.g. in the channels of the input data images, to generate further training datasets.

It should also be noted in this connection that it is conceivable that the training input data is determined from real magnetic resonance data acquired at different basic field strengths, i.e. for example by using combination datasets for basic field strengths of 0.55 tesla, 1.5 tesla, and 3 tesla. As mentioned, it has been shown that the trained function may then be used for different basic field strengths.

In the transfer learning that is to be carried out, it is possible in principle to adopt known approaches. For example, it is conceivable, at least in a first training step, to initially remove only the classifier and replace it with a new classifier that is to be trained. However, it is also conceivable, e.g. in subsequent training steps or else immediately, to also include in the training at least some of the last layers of the convolutional base. In a last training step, it would then also be conceivable finally to make all trainable parameters of the function that is to be trained further adaptable, i.e. to make the pre-trained function as a whole trainable. Generally, a beneficial development of the training method may therefore provide that an increasing proportion of the pre-trained function is trained further in a succession of multiple training steps.

A training system is also conceivable for training or providing the trained function. Such a training system for providing a trained function for use as part of an assignment algorithm which determines, from an input dataset that has been determined from combination datasets, assignment information assigning to each combination dataset a spin species shown therein, wherein the combination datasets in each case show magnetic resonance signals of a different spin species and were determined from two image datasets of a scan region of a patient that were acquired by means of an acquisition technique at different echo times in each case, by combination of the image datasets, wherein the trained function is embodied to use input data of the input dataset in order to determine output data that is used to determine the assignment information, has:

a first training interface for providing training datasets, each of which comprises training input data and associated training output data describing the spin species assignment of the training input data, and a pre-trained function, a training unit for further training of at least one component of the pre-trained function, e.g. at least one last layer of the pre-trained function, using the training datasets for determining the trained function, and a second training interface for providing the trained function.

All statements relating to the training method and also to the evaluation method may be applied analogously to the training system.

The evaluation method may also be carried out by means of an evaluation system. In other words, an evaluation system for evaluating magnetic resonance data of a scan region of a patient acquired by means of a magnetic resonance device is conceivable, having:

a first interface for receiving at least two image datasets that were acquired using an acquisition technique at different echo times in each case, a combination unit for combining the image datasets into combination datasets showing at least two magnetic resonance signals of a different spin species in each case, a determination unit for determining an input dataset from the combination datasets, and an assignment unit for evaluating the input dataset by means of an assignment algorithm comprising a trained function and determining assignment information assigning to each combination dataset the spin species shown therein, and which is characterized in that the assignment unit is embodied to use a pre-trained function trained further with regard to the spin species assignment by means of transfer learning as the trained function.

All statements relating to the evaluation method according to the disclosure may of course also be applied analogously to the evaluation system.

The disclosure further relates to a magnetic resonance device having a control device embodied to carry out the evaluation method according to the disclosure. In other words, it may also be said that the magnetic resonance device comprises an evaluation system as just described. All statements relating to the previously-discussed subject matters, e.g. with respect to the evaluation method, may be applied analogously to the magnetic resonance device according to the disclosure, which therefore also provides the already cited advantages.

Thus, the control device may comprise the already-cited components of the evaluation system, e.g. the combination unit, the determination unit, and the assignment unit. Since the control device may also be implemented for the overall operation of the magnetic resonance device, it may also have in addition a sequence unit via which magnetic resonance data may be acquired by means of magnetic resonance sequences or acquisition techniques in general, e.g. also the image datasets used in the method according to the disclosure and acquired at different echo times. To implement such functional units, the control device may, generally speaking, contain at least one processor and at least one storage means, both processed data and parameters of algorithms, as well as the algorithms themselves, being storable in the storage means.

A computer program according to the disclosure is for example directly loadable into a storage means of a computing device, e.g. of an evaluation system and/or a control device of a magnetic resonance device, and has program means for performing the steps of a method according to the disclosure when the computer program is executed in the computing device. The computer program may be stored on an electronically-readable data medium according to the disclosure, which therefore comprises electronically readable control information stored thereon, and which comprises at least one computer program according to the disclosure and is implemented in such a way that the computer program performs a method according to the disclosure when the data medium is used in a computing device, e.g. of an evaluation system and/or a control device of a magnetic resonance device. The data medium may be any suitable type of non-transitory data medium, such as a CD-ROM, for example.

Within the scope of the present disclosure, corresponding training computer programs are of course also conceivable for the described training method, which means a training computer program is possible which may for example be loaded directly into storage means of a training system and has program means for performing the steps of a herein-described training method when the training computer program is executed in the training system. The training computer program may also be stored on an electronically-readable data medium.

BRIEF DESCRIPTION OF THE DRAWINGS/FIGURES

Further advantages and specific details of the present disclosure will become apparent from the exemplary embodiments described below, as well as with reference to the drawing, in which:

FIG. 3 illustrates an example flowchart of the evaluation method, in accordance with one or more embodiments of the disclosure;

FIG. 4 illustrates example substeps for determining an input dataset, in accordance with one or more embodiments of the disclosure;

DETAILED DESCRIPTION

Figure 1:
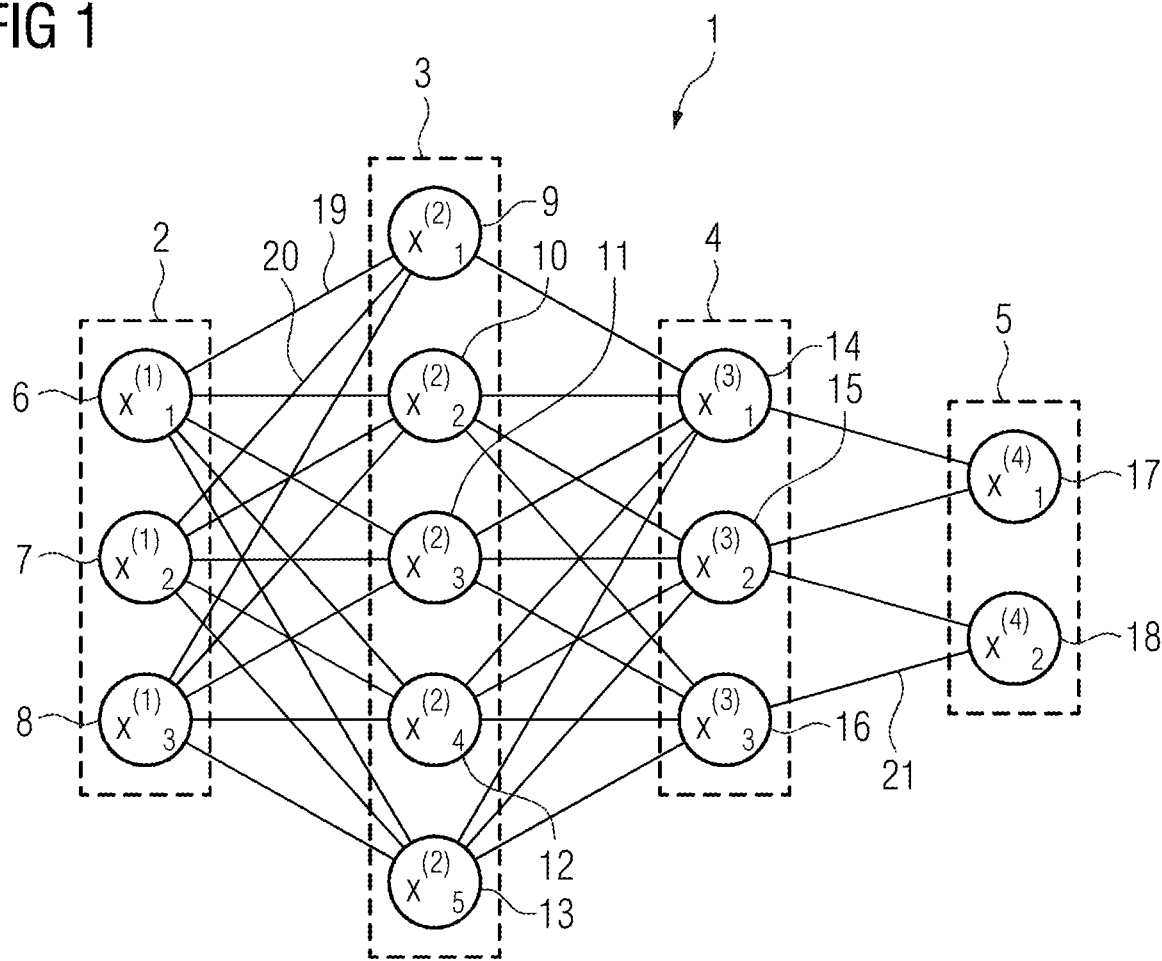
FIG. 1 illustrates an example of an artificial neural network, in accordance with one or more embodiments of the disclosure.

FIG. 1 shows an exemplary embodiment of an artificial neural network 1. Technical terms for the artificial neural network 1 as used herein may include a "neural network," an "artificial neural net," or a "neural net".

The artificial neural network 1 comprises nodes 6 to 18 and edges 19 to 21, wherein each edge 19 to 21 represents a directed connection from a first node 6 to 18 to a second node 6 to 18. Generally, the first node 6 to 18 and the second node 6 to 18 are different nodes 6 to 18, though it is also conceivable that the first node 6 to 18 and the second node 6 to 18 are identical. In FIG. 1, for example, the edge 19 represents a directed connection from node 6 to node 9 and the edge 21 represents a directed connection from node 16 to node 18. An edge 19 to 21 from a first node 6 to 18 to a second node 6 to 18 is referred to as an ingoing edge for the second node 6 to 18, and as an outgoing edge for the first node 6 to 18.

In this exemplary embodiment, the nodes 6 to 18 of the artificial neural network 1 may be arranged in layers 2 to 5, wherein the layers may have an intrinsic order that is introduced between the nodes 6 to 18 by the edges 19 to 21. For example, the edges 19 to 21 may be provided only between adjacent layers of nodes 6 to 18. In the illustrated exemplary embodiment, there exists an input layer 2 containing only the nodes 6, 7, 8, in each case without ingoing edge. The output layer 5 has only the nodes 17, 18, in each case without outgoing edges, hidden layers 3 and 4 furthermore lying between the input layer 2 and the output layer 5. In the general case, an arbitrary number of hidden layers 3, 4 may be chosen. The number of nodes 6, 7, 8 of the input layer 2 typically corresponds to the number of input values fed into the neural network 1, and the number of nodes 17, 18 in the output layer 5 typically corresponds to the number of output values of the neural network 1.

As one example, a (real) number may be assigned to the nodes 6 to 18 of the neural network 1. In this case, $x^{(n)}_i$ denotes the value of the i-th node 6 to 18 of the n-th layer 2 to 5. The values of the nodes 6, 7, 8 of the input layer 2 are equivalent to the input values of the neural network 1, while the values of the nodes 17, 18 of the output layer 5 are equivalent to the output values of the neural network 1. In addition, each edge 19, 20, 21 may be assigned a weight in the form of a real number. For instance, the weight is a real number in the interval [−1, 1] or in the interval [0, 1,]. In this case, $w^{(m,n)}_{i,j}$ denotes the weight of the edge between the i-th nodes 6 to 18 of the m-th layer 2 to 5 and the j-th nodes 6 to 18 of the n-th layer 2 to 5. Furthermore, the abbreviation $w^{(n)}_{i,j}$ is defined for the weight $w^{(n,n+1)}_{i,j}$.

In order to calculate output values of the neural network 1, the input values are propagated through the neural network 1. In particular, the values of the nodes 6 to 18 of the (n+1)-th layer 2 to 5 can be calculated based on the values of the nodes 6 to 18 of the n-th layer 2 to 5 by Equation 1 as follows:

$$x_j^{(n+1)} = f\left(\sum_i x_i^{(n)} \cdot w_{i,j}^{(n)}\right) \quad \text{Eqn. 1}$$

Here, f is a transfer function, which may also be referred to as an activation function. Known transfer functions are unit step (threshold) functions, sigmoid functions (for example the logistic function, the generalized logistic function, the hyperbolic tangent, the arcus tangent, the error function, the smoothstep function), and rectifier functions. The transfer function is used essentially for normalization purposes.

For instance, the values are propagated layer-by-layer through the neural network 1, values of the input layer 2 being given by the input data of the neural network 1. Values of the first hidden layer 3 may be calculated based on the values of the input layer 2 of the neural network 1, values of the second hidden layer 4 may be calculated based on the values in the first hidden layer 3, etc.

To enable the values $w_{i,j}^{(n)}$ for the edges 19 to 21 to be specified, the neural network 1 may be trained using training data. For example, training data comprises training input data and training output data, which are referred to herein as $t_i$. For a training step, the neural network 1 is applied to the training input data to determine the calculated output data. For example, the training output data and the calculated output data may comprise a number of values, the number being determined as the number of nodes 17, 18 of the output layer 5.

For instance, a comparison between the calculated output data and the training output data may be used to fit the weights within the neural network 1 recursively (e.g. as part of a "backpropagation algorithm"). For example, the weights may be changed according to Equation 2 below as follows:

$$w'^{(n)}_{i,j} = w^{(n)}_{i,j} - \gamma \cdot \delta_j^{(n)} \cdot x_i^{(n)}, \quad \text{Eqn. 2}$$

where γ represents a learning rate and the numbers $\delta_j^{(n)}$ may be calculated recursively in accordance with Equation 3 below as follows:

$$\delta_j^{(n)} = \left(\sum_k \delta_k^{(n+1)} \cdot w_{j,k}^{(n=1)}\right) \cdot f'\left(\sum_i x_i^{(n)} \cdot w_{i,j}^{(n)}\right), \quad \text{Eqn. 3}$$

based on $\delta_j^{(n+1)}$ if the (n+1)-th layer is not the output layer 5, and in accordance with Eqn. 4 below as follows:

$$\delta_j^{(n)} = (x_k^{(n+1)} - t_j^{(n+1)}) \cdot f'\left(\sum_i x_i^{(n)} \cdot w_{i,j}^{(n)}\right), \quad \text{Eqn. 4}$$

if the (n+1)-th layer is the output layer 5, where f represents the first derivative of the activation function and $\gamma_j^{(n+1)}$ represents the comparison training value for the j-th node 17, 18 of the output layer 5.

An example of a convolutional neural network (CNN) is also given below with regard to FIG. 2. It should be noted here that the term "layer" is used there in a slightly different way than for conventional neural networks. For a conventional neural network, the term "layer" refers only to the set of nodes that forms a layer, i.e. a particular generation of nodes. For a convolutional neural network however, the term "layer" is often used as an object which actively changes data, in other words as a set of nodes of the same generation and either the set of ingoing or the set of outgoing edges.

Figure 2:
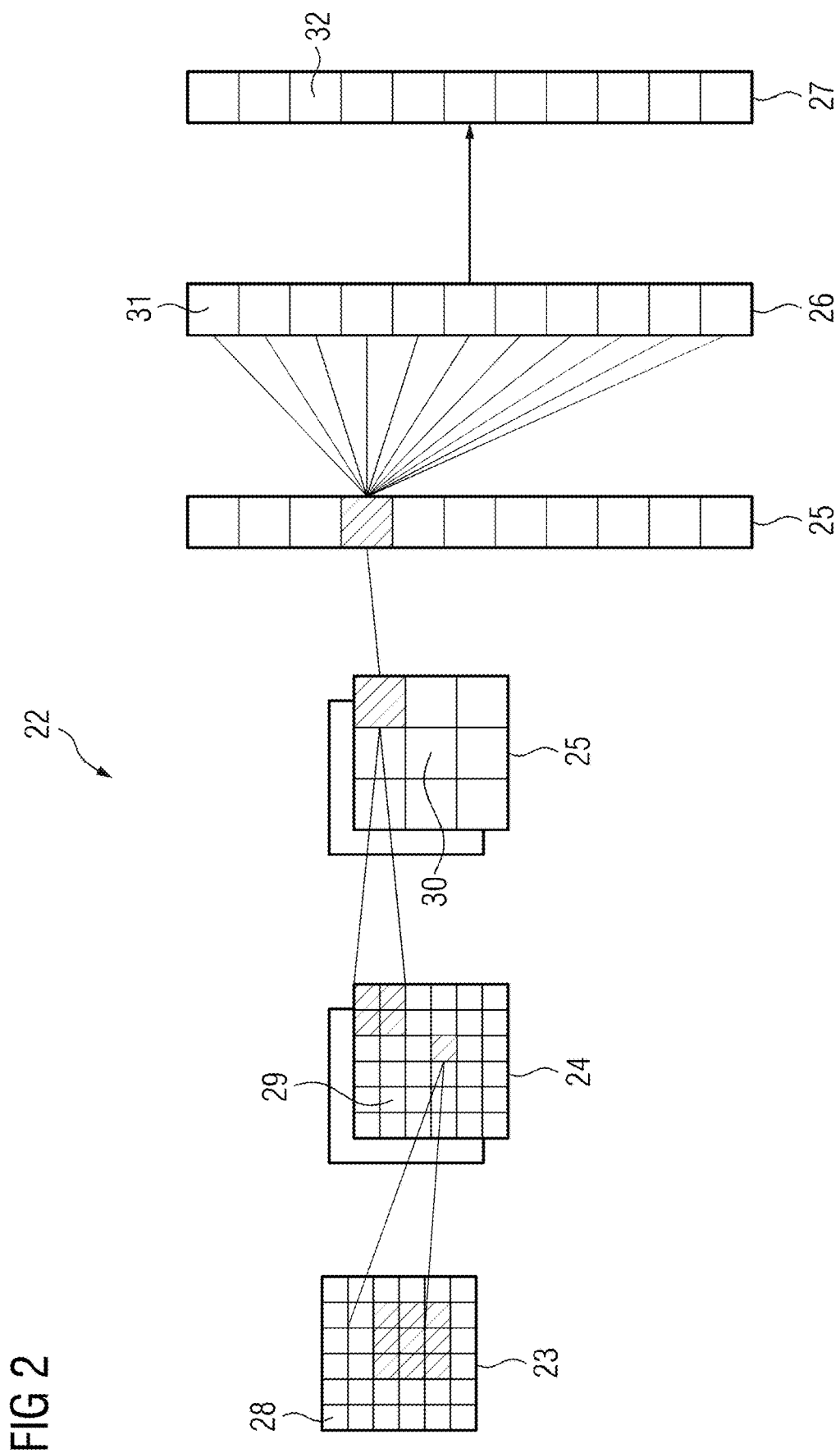
FIG. 2 illustrates an example convolutional neural network, in accordance with one or more embodiments of the disclosure.

FIG. 2 shows an exemplary embodiment of a convolutional neural network 22. In the illustrated exemplary embodiment, the convolutional neural network 22 comprises an input layer 23, a convolutional layer 24, a pooling layer 25, a fully connected layer 26, and an output layer 27. In alternative embodiments, the convolutional neural network 22 may contain multiple convolutional layers 24, multiple pooling layers 25, and multiple fully connected layers 26, just like other types of layers. The order of the layers may be chosen arbitrarily, fully connected layers 26 usually forming the last layers before the output layer 27.

Within a convolutional neural network 22, the nodes 28 to 32 of one of the layers 23 to 27 may be understood as arranged in a d-dimensional matrix or as a d-dimensional image. For instance, in the two-dimensional case, the value of a node 28 to 32 may be designated by means of the indices i, j in the n-th layer 23 to 27 as $x^{(n)}[i,j]$. It should be pointed out that the arrangement of the nodes 28 to 31 of a layer 23 to 27 has no effect on the calculations within the convolutional neural network 22 as such, since these effects are given exclusively by the structure and the weights of the edges.

A convolutional layer 24 is characterized e.g. in that the structure and the weights of the ingoing edges form a convolutional operation based on a specific number of kernels. For example, the structure and the weights of the ingoing edges may be chosen such that the values $x_k^{(n)}$ of the nodes 29 of the convolutional layer 24 are determined as a convolution $x_k^{(n)} = K_k * x^{(n-1)}$ based on the values $x^{(n-1)}$ of the nodes 28 of the preceding layer 23, where the convolution * may be defined in the two-dimensional case in accordance with Eqn. 5 below as follows:

$$x_k^{(n)}[i,j] = \quad \text{Eqn. 5}$$
$$(K_k * x^{(n-1)})[i,j] = \sum_{i'} \sum_{j'} K_k[i',j'] \cdot x^{(n-1)}[i-i', j-j']$$

Therein, the k-th kernel $K_k$ represents a d-dimensional matrix, in this exemplary embodiment a two-dimensional matrix, which is typically small compared to the number of nodes 28 to 32, for example a 3×3 matrix or a 5×5 matrix. For instance, this implies that the weights of the ingoing edges are not independent but are chosen such that they generate the above convolutional equation. In the example of a kernel that forms a 3×3 matrix, there exist nine independent weights (where each entry of the kernel matrix corresponds to an independent weight), irrespective of the number of nodes 28 to 32 in the corresponding layer 23 to 27. For instance, for a convolutional layer 24, the number of nodes 29 in the convolutional layer 24 is equivalent to the number of nodes 28 in the preceding layer 23 multiplied by the number of convolutional kernels.

If the nodes 28 of the preceding layer 23 are arranged as a d-dimensional matrix, the use of the majority of kernels may be understood as adding a further dimension, which is also referred to as the depth dimension, such that the nodes 29 of the convolutional layer 24 are arranged as a (d+1)-dimensional matrix. If the nodes 28 of the preceding layer 23 are already arranged as a (d+1)-dimensional matrix with a depth dimension, the use of a majority of convolutional kernels may be understood as an expansion along the depth dimension, such that the nodes 29 of the convolutional layer 24 are likewise arranged as a (d+1)-dimensional matrix, the size of the (d+1)-dimensional matrix being greater in the depth dimension by the factor formed by the number of kernels than in the preceding layer 23.

The advantage of using convolutional layers 24 is that the spatially local correlation of the input data may be made good use of by creating a local connection pattern between nodes of adjacent layers, e.g. owing to the fact that each node has connections to a small section of the nodes of the preceding layer.

In the illustrated exemplary embodiment, the input layer 23 comprises thirty-six nodes 28 arranged as a two-dimensional 6×6 matrix. The convolutional layer 24 comprises seventy-two nodes 29 arranged as two two-dimensional 6×6 matrices, each of the two matrices being the result of a convolution of the values of the input layer 23 with a convolutional kernel. In the same way, the nodes 29 of the convolutional layer 24 may be understood as arranged in a three-dimensional 6×6×2 matrix, the last-cited dimension being the depth dimension.

A pooling layer 25 is characterized in that the structure and the weights of the ingoing edges as well as the activation function of their nodes 30 define a pooling operation based on a nonlinear pooling function f. In the two-dimensional case, for example, the values $x^{(n)}$ of the nodes 30 of the pooling layer 25 are calculated based on the values $x^{(n+1)}$ of the nodes 29 of the preceding layer 24 in accordance with Equation 6 below as follows:

$$x^{(n)}[i,j] = \quad \text{Eqn. 6}$$
$$f(x^{(n-1)}[id_1, jd_2], \ldots, x^{(n-1)}[id_1 + d_1 - 1, jd_2 + d_2 - 1])$$

In other words, using a pooling layer 25 enables the number of nodes 29, 30 to be reduced by replacing a number of $d_1 \times d_2$ adjacent nodes 29 in the preceding layer 24 by a single node 30, which is calculated as a function of the values of the cited number of adjacent nodes 29. In particular, the pooling function f may be a maximum function, an averaging or the L2 norm. For instance, the weights of the ingoing edges may be specified for a pooling layer 25 and not be modified by training.

The advantage of using a pooling layer 25 is that the number of nodes 29, 30, and the number of parameters, are reduced. This leads to a reduction in the necessary calculation volume within the convolutional neural network 22 and consequently to a control of the overfitting.

In the illustrated exemplary embodiment, the pooling layer 25 is a max pooling layer in which four adjacent nodes are replaced by just one single node whose value is formed by the maximum of the values of the four adjacent nodes. The max pooling is applied to each d-dimensional matrix of the previous layer; in this exemplary embodiment, the max pooling is applied to each of the two two-dimensional matrices such that the number of nodes is reduced from 72 to 18.

A fully connected layer 26 is characterized in that a majority of, e.g. all, edges between the nodes 30 of the previous layer 25 and the nodes 31 of the fully connected layer 26 are present, wherein the weight of each of the edges may be fitted individually. In this exemplary embodiment, the nodes 30 of the preceding layer 25 and of the fully connected layer 26 are shown both as two-dimensional matrices and as non-contiguous nodes (represented as a line of nodes, the number of nodes having been reduced for better clarity of illustration). In this exemplary embodiment, the number of nodes 31 in the fully connected layer 26 is equal to the number of nodes 30 in the preceding layer 25. In alternative embodiment variants, the number of nodes 30, 31 may be different.

In addition, in this exemplary embodiment the values of the nodes 32 of the output layer 27 are determined by applying the softmax function to the values of the nodes 31 of the preceding layer 26. By applying the softmax function, the sum of the values of all nodes 32 in the output layer 27 is one, and all values of all the nodes 32 in the output layer are real numbers between 0 and 1. When the convolutional neural network 22 is used for classifying input data, e.g. the values of the output layer 27 can be interpreted as a probability that the input data falls into one of the different classes.

A convolutional neural network 22 may also have a ReLU layer, ReLU standing as an acronym for "rectified linear units." For example, the number of nodes and the structure of the nodes within a ReLU layer is equivalent to the number of nodes and the structures of the nodes of the preceding layer. The value of each node in the ReLU layer may be calculated e.g. by applying a rectifier function to the value of the corresponding node of the preceding layer. Examples of rectifier functions are $f(x)=\max(0,x)$, the hyperbolic tangent, or the sigmoid function.

Convolutional neural networks 22 may be trained e.g. based on a backpropagation algorithm. To avoid an overfitting, regularization methods may be used, e.g. a dropout of individual nodes 28 to 32, stochastic pooling, use of artificial data, weight decay based on the L1 or L2 norm, or maximum norm constraints.

FIG. 3 shows a flowchart of an exemplary embodiment of the evaluation method according to the disclosure, i.e. of the method for evaluating magnetic resonance data of a scan region of a patient acquired by means of a magnetic resonance device.

In the present case, an exemplary embodiment related to a TSE-Dixon technique is to be discussed, which means a TSE sequence is used as the magnetic resonance sequence and the aim is to have available, on completion of the evaluation method, two combination datasets, to each of which one spin species of the two spin species considered here is assigned, namely spins of protons bound to fat (fat spins) and spins of protons bound to water (water spins). In other words, a water image (a first of the combination datasets) and a fat image (a second of the combination datasets) with clear corresponding labeling are to be present as the result of the method.

For this purpose, in a step S1, which may be part of the method but may also be performed ahead of the actual evaluation method, two image datasets of the scan region of the patient are acquired, both by means of the same TSE sequence, the only difference being the echo times. The echo times may be chosen for example such that under ideal conditions one of the image datasets would be what is termed an in-phase image dataset, the other what is termed an opposed-phase image dataset, in other words the fat spins and the water spins would be in phase in the first image dataset and would have precisely the opposite phase in the other image dataset.

In most cases, however, other phase relationships are present due to various influences, for example B0 inhomogeneities, eddy currents, and susceptibility effects.

For this reason, the combination algorithm applied in a step S2, in this case a Dixon algorithm, takes these effects into account and corrects for them to nonetheless determine as a result two combination datasets obtained e.g. by a calculation-applied image element by image element to the image datasets, of which each is assigned to precisely one of the two spin species, in other words shows only magnetic resonance signals of the spin species. The steps that now follow serve to discover which of the combination datasets is the water image, i.e. is assigned to the water spins, and which of the combination datasets is the fat image, i.e. is assigned to the fat spins.

For this purpose, an assignment algorithm is to be used, for which, in a step S3, an input dataset is initially determined from the combination datasets. In the present example, successive substeps are employed, which are explained in more detail by FIG. 4. Shown there firstly on the left-hand side are the combination datasets 33, 34, which, since the image datasets were also acquired in multiple slices as a slice stack, are present as slice stacks of individual slice images 35, 36.

In a first substep, indicated by the arrow 37, said slice images are now downscaled to a square size in each case, in the present example to 112×112 image elements (pixels in this instance, on account of the two-dimensional slice images 35, 36). Of course, other small square sizes are also conceivable, for example 96×96 image elements, or the like. If the aspect ratio is to be maintained in this case, a square shape may be achieved by way of example by sidewise cropping in the case of the longer side. This results in the downscaled slice images 35', 36'.

For these downscaled slice images 35', 36', there now follows a filter step 38, in which some of the slice images of certain slices are separated out by sorting on the basis of a filter criterion. In other exemplary embodiments, this filter step 38 may also take place before the downscaling in substep 37, its application to the downscaled slice images 35', 36' being preferred on account of the already reduced amount of data.

The at least one filter criterion serves to separate out slices in which too low an image intensity is present. This therefore relates to such slices whose image content consists at least mainly of noise, since an assignment for the corresponding slice images leads in most cases to a tied result, which would lower the accuracy of the assignment. If the filter criterion for a slice image 35', 36' of a particular slice is met in this case, both slice images 35', 36' of the corresponding slice are excluded from further consideration since these, as will be explained later, are considered jointly.

In the present exemplary embodiment, the filter criterion checks whether the average intensity of the currently checked slice image 35', 36', i.e. the average value of the image element values (pixel values) in the corresponding slice image 35', 36', is less than 10% of the average intensity, i.e. of the average image element value, of the entire associated slice stack. Other threshold values may of course also be made of use here, for example also be increased to 20 or 30%, since slice images 35', 36' not affected or affected little by noise lead to extremely clear assignments, i.e. a small number of slices may be sufficient for determining assignment information, which reduces the required computing power. As an alternative to average intensities, the filter criterion may also check maximum intensities.

Following the filter step 38, the slice images 35', 36' of the remaining slices are normalized in a normalization step 39 in such a way that the entire available dynamic range is used for image element values, for example 0 to 255, 4095, or 65535. This may be achieved for example by setting the previous maximum image element value in an individual slice image 35' to the maximum value according to dynamic range (i.e. for example 255, 4095, or 65535), and co-scaling the remaining image element values accordingly. This entails an individual consideration of every single slice image 35', 36', which led to the best results in experiments that have been conducted. Alternatively, it is conceivable in certain circumstances to refer the normalization to greater proportions, e.g. entire slice stacks or even both slice stacks.

Following this normalization, for each slice remaining in the consideration, the associated slice images 35', 36' are merged in accordance with the arrows 40 to form an RGB input data image 41, whereby the slice image 35' fills the red color channel of the RGB input data image, and the slice image 36' fills the blue color channel of the RGB input data image 41. Whereas, in the present illustrated exemplary embodiment, the blue color channel of the RGB input data image 41 remains plainly empty, it is also conceivable to fill this with a linear combination of the slice images 35', 36' assigned to the slice, for example an addition or a subtraction.

At the end of step S3 there is therefore available as the input dataset 42 a slice image stack composed of RGB slice images 41 for the slices that are still to be considered.

The input dataset 42 is evaluated in a step S4 by means of an assignment algorithm to determine assignment information that assigns to the respective combination datasets 33, 34 the spin species represented therein. This entails using a trained function, which is a pre-trained function trained further with regard to the spin species assignment by means of transfer learning. The trained function comprises a CNN and in the present case is based on a pre-trained ResNet-18. In the training process, which will be described in greater detail below, the classifier is replaced in such a way that a regression value assuming values from zero to one is returned as output data, the value zero indicating that the spin species fat is shown in the red color channel, and the value one indicating that the spin species water spins is present in the red color channel.

Figure 5:
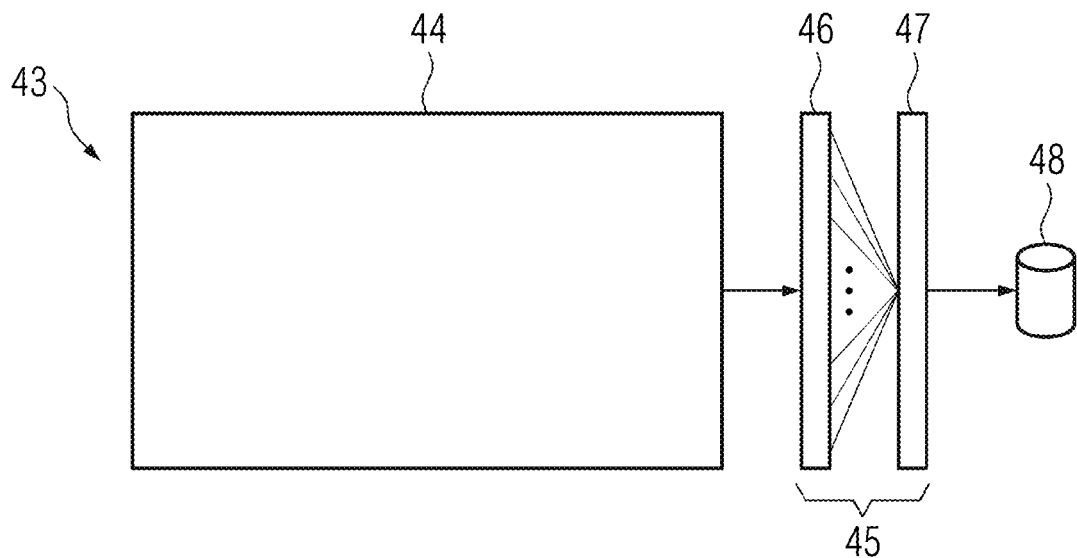
FIG. 5 illustrates an example structure of a trained function, in accordance with one or more embodiments of the disclosure.

FIG. 5 shows the rough structure of the trained function 43 more precisely. This comprises a convolutional base 44, which is unchanged compared to the pre-trained ResNet-18 and which, as is generally known, is constructed mainly of convolutional layers 24 and pooling layers 25. Adjoining the convolutional base 44 is the classifier 45 specifically for the spin species assignment, which in the present case has a first fully connected layer 46 comprising 512 nodes and a second fully connected layer 47 comprising one node, such that the regression value 48 is obtained.

In step S4, the trained function 43 receives an RGB input data image 41 of a slice as input data in each case within the scope of the assignment algorithm, and delivers the respective regression value 48 as output data, such that regression values 48 are available at the end for all slices, which are merged by majority voting to form an end result with regard to the assignment. In this process, an average value of the regression values 48 can be formed, for example.

Optionally, to increase the degree of accuracy, it can be provided to apply the trained function also to a second slice image stack comprising RGB input data images, in which the contents of the red and green color channels are transposed compared to the RGB input data images 41. This should of course also be taken into account accordingly when the resulting regression values 48 are merged.

Steps S2 to S4 may be provided in combined form as an evaluation function 49, for example a Dixon function.

According to step S5, an output of the correctly-labeled combination datasets as fat image and water image may then be performed, for example.

Figure 6:
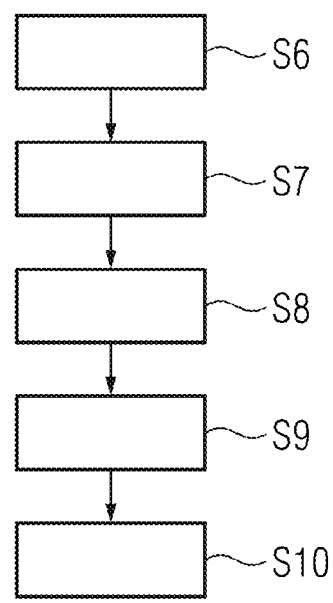
FIG. 6 illustrates an example flowchart of a training method, in accordance with one or more embodiments of the disclosure.

FIG. 6 shows a flowchart of a training method for training the function 43. Here, in a step S6, real acquired magnetic resonance data is initially provided, for the combination datasets of which it is known, which is the fat image and which is the water image. This magnetic resonance data of different patients or volunteers is edited in a step S7 to determine training datasets, i.e., as described in relation to FIG. 4, to determine pairs of RGB input data images 41, of which each pair forms input data of a training dataset for which the desired result, i.e. the regression value 48, is known as zero or one.

However, from these training datasets derived directly from the real acquired magnetic resonance data, it is also possible to derive further training datasets in which the RGB input data images are transformed, for example by rotation, mirroring, shearing, and/or change in contrast. In this way, the set of training datasets is increased further. Further training datasets may also be generated by swapping the red color channel and the green color channel, as described herein.

It should further be noted that the filter step 38 of FIG. 4 does not necessarily have to be applied, since the function 43 may also learn in this way to arrive at a tied result in the case of an input data image containing at least mainly noise.

The pre-trained function, in this case the ResNet-18, is then provided in a step S8 so that the training by means of transfer learning may be performed using the training datasets in a step S9. This may also be accomplished e.g. in stages by incorporating an increasing number of layers of the function 43 into the further training, until, where necessary, at the end even the function 43 as a whole is trained.

The trained function 43 may then be provided in a step S10.

Figure 7:
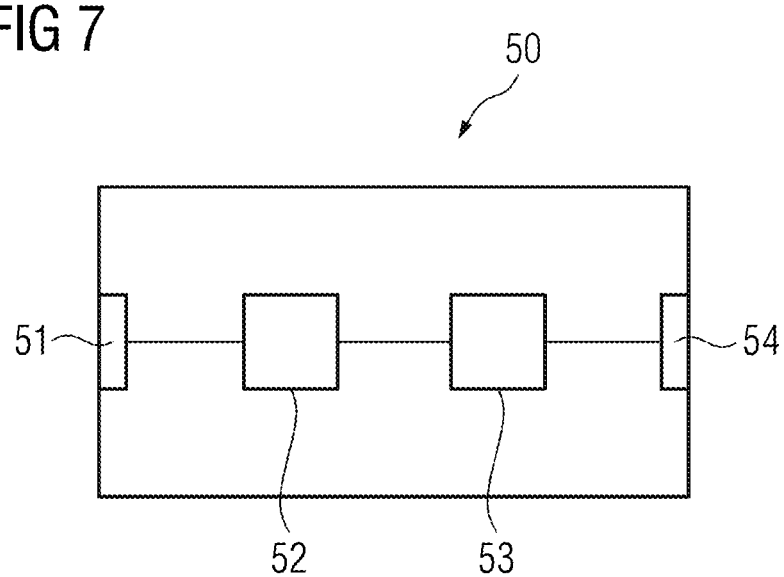
FIG. 7 illustrates an example functional layout of a training system, in accordance with one or more embodiments of the disclosure.

FIG. 7 shows a training system 50 by means of which the method described in FIG. 6 may be carried out. The training system 50 comprises a first training interface 51 via which the magnetic resonance data and the pre-trained function may be received. The training datasets are determined according to step S7 from the magnetic resonance data in a determination unit 52 and provided further via an internal training interface (not shown) together with the pre-trained function. The further training according to step S9 may take place in a training unit 53. A second training interface 54 serves to output the trained function 43 according to step S10 following completion of the training.

It should also be noted that it is entirely conceivable in the method according to the disclosure for the training method to be understood as part of the evaluation method; it is however assumed that when the evaluation method is applied, the training has already been concluded and the trained function 43 is available accordingly.

Figure 8:
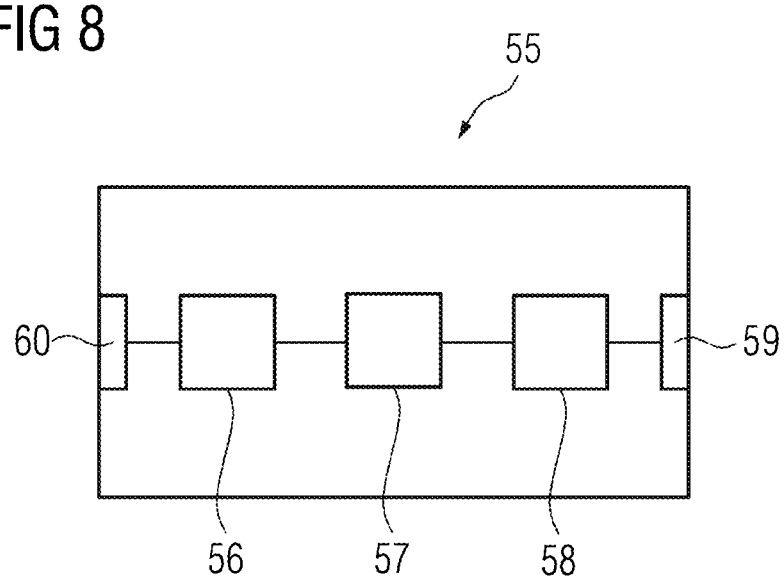
FIG. 8 illustrates an example functional layout of an evaluation system, in accordance with one or more embodiments of the disclosure.

FIG. 8 shows an evaluation system 55 by means of which the evaluation method according to FIG. 3 can be carried out. The evaluation system 55 comprises a first interface 60 via which the image datasets, as well as possibly further information, may be received. The combination algorithm according to step S2 may then be applied in a combination unit 56 (e.g. combination circuitry, which may include one or more processors, and/or processing circuitry, which may include hardware, software, executable instructions, or combinations of these) to determine the combination datasets 33, 34.

The input dataset 42 is determined according to step S3 in a determination unit 57 (e.g. determination circuitry, which may include one or more processors, and/or processing circuitry, which may include hardware, software, executable instructions, or combinations of these). The input dataset 42 may then be used in an assignment unit 58 (e.g. assignment circuitry, which may include one or more processors, and/or processing circuitry, which may include hardware, software, executable instructions, or combinations of these) and which serves to execute the assignment algorithm to generate the assignment information and output the same at a second interface 59. The assignment unit 58 utilizes the trained function 43 accordingly, as described herein.

Figure 9:
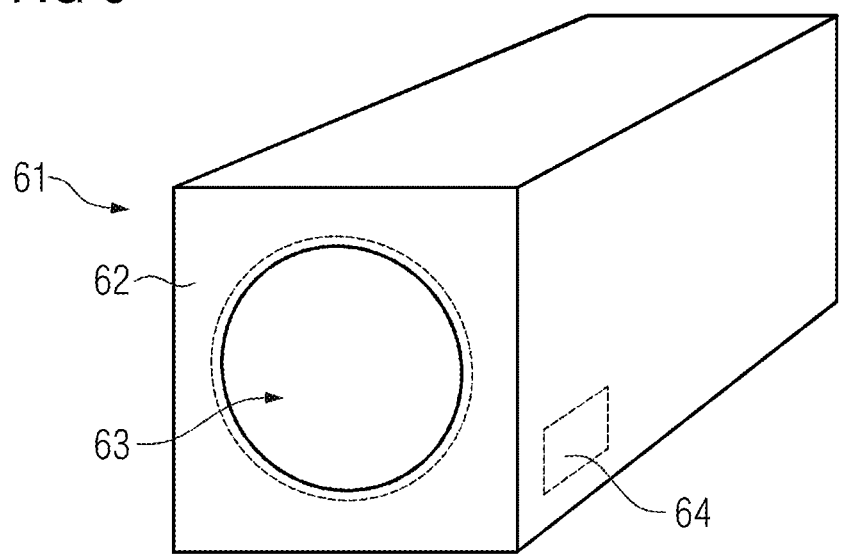
FIG. 9 illustrates an example magnetic resonance device, in accordance with one or more embodiments of the disclosure.

FIG. 9 shows a magnetic resonance device 61 according to the disclosure. As is generally known, this has a main magnet unit 62, which defines a patient receiving zone 63. A patient may be introduced into the latter by means of a patient couch (not shown in more detail). The main magnet unit 62 contains the basic field magnet, wherein the patient receiving zone 63 may be arranged surrounding a radiofrequency (RF) coil array and a gradient coil array (each likewise not shown). The operation of the magnetic resonance device 61 is controlled by a control device 64 (e.g. a computing device, controller, and/or control circuitry, which may include one or more processors, processing circuitry, hardware, software, executable instructions, or combinations of these) which is also configured or otherwise implemented to carry out the evaluation method according to the disclosure, e.g. the entire method illustrated in FIG. 3, since the acquisition scan is also controlled by the control device 64.

Figure 10:
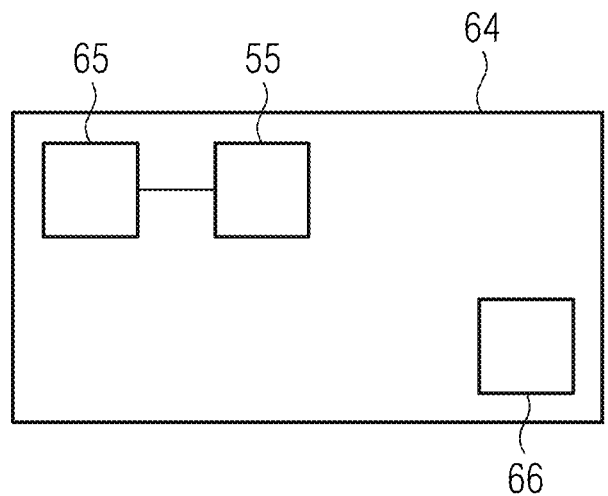
FIG. 10 illustrates an example functional layout of a control device of the magnetic resonance device, in accordance with one or more embodiments of the disclosure.

The functional layout of the control device 64 is shown schematically in FIG. 10. According thereto, the control device 64 also comprises, in addition to the already described evaluation system 55, a sequence unit 65 (e.g. sequence generation circuitry, which may include one or more processors, and/or processing circuitry, which may include hardware, software, executable instructions, or combinations of these) which controls the scanning operation of the magnetic resonance device 61 and consequently is also configured or otherwise implemented to perform step S1, for example.

Each of the functional units discussed herein may be implemented by way of at least one processor of the control device 64, which also additionally includes a storage means 66. A processor and a storage means may accordingly also comprise the computing devices of the training system 50 and/or the evaluation system 55.

Exemplary embodiments of the present disclosure may therefore be described in a summary and generally formulated manner also as follows:

Exemplary embodiment 1: A computer-implemented method for evaluating magnetic resonance data of a scan region of a patient by means of a magnetic resonance device, wherein, following acquisition of at least two image datasets using an acquisition technique at different echo times in each case, at least two combination datasets in each case showing magnetic resonance signals of a different spin species are determined by combination of the image datasets, wherein, to assign a spin species shown in the combination dataset to each combination dataset, an input dataset is determined from the combination datasets, and the input dataset is evaluated by means of an assignment algorithm, which comprises a trained function and determines assignment information assigning to each combination dataset the spin species shown therein, characterized in that a pre-trained function trained further with regard to the spin species assignment by means of transfer learning is used as the trained function.

Exemplary embodiment 2: A method according to exemplary embodiment 1, characterized in that the spin species are or comprise spins of protons bound to fat and spins of protons bound to water, and/or that in order to determine the combination datasets, a Dixon algorithm which is embodied to take account of deviations from assumed phase relationships between the spin species occurring due to interference effects during acquisition of the image datasets, and/or image datasets acquired by means of a turbo spin-echo sequence are used.

Exemplary embodiment 3: A method according to one of the preceding exemplary embodiments, characterized in that to determine the input data, the combination datasets are downscaled to a lower resolution by more than 90% and/or to a size of 60 to 240 by 60 to 240 per slice image, preferably square in shape.

Exemplary embodiment 4: A method according to one of the preceding exemplary embodiments, characterized in that to determine the input data, the downscaled, combination datasets are normalized to take advantage of the entire possible dynamic range for image element values, wherein the normalization is performed independently for each slice and each combination dataset.

Exemplary embodiment 5: A method according to one of the preceding exemplary embodiments, characterized in that to determine the input data, slice images of the combination datasets showing the same slice are consolidated to form a multichannel input data image.

Exemplary embodiment 6: A method according to exemplary embodiment 5, characterized in that RGB channels are used as the channels and/or, given a number of channels greater than the number of combination datasets, at least one of the channels not used by an individual slice image is used for a combination image formed in particular by linear combination from the slice images.

Exemplary embodiment 7: A method according to exemplary embodiment 5 or 6, characterized in that to increase the degree of accuracy, the trained function is additionally applied also to input data in which the assignment of the individual combination datasets to the channels is transposed, wherein all the results of the trained function are incorporated into the assignment information.

Exemplary embodiment 8: A method according to one of the preceding exemplary embodiments, characterized in that when the input data is compiled, at least some of the combination data, e.g. slice images, showing at least mainly noise and/or a low intensity, are separated out by sorting on the basis of a filter criterion.

Exemplary embodiment 9: A method according to exemplary embodiment 8, characterized in that the filter criterion separates out slice images whose average and/or maximum image element value falls below a threshold value, wherein the threshold value is chosen as a function of the average or maximum image element value occurring in all the combination data of the combination datasets.

Exemplary embodiment 10: A method according to one of the preceding exemplary embodiments, characterized in that the trained function is applied slice-by-slice in the case of image datasets acquired as slice image stacks, wherein the assignment information is determined from the results for the different slices on the basis of a majority vote.

Exemplary embodiment 11: A method according to one of the preceding exemplary embodiments, characterized in that the trained function comprises a convolutional neural network, e.g. a ResNet-18 and/or a ResNet-34 and/or a SqueezeNet and/or an AlexNet and/or a VGG network.

Exemplary embodiment 12: A method according to one of the preceding exemplary embodiments, characterized in that in the case of two spin species, the trained function returns a regression value lying between zero and one, where zero corresponds to an assignment of a first spin species to a defined one of the combination datasets, and one corresponds to an assignment of the second spin species to the defined one of the combination datasets.

Exemplary embodiment 13: A computer-implemented method for providing a trained function for use as part of an assignment algorithm which determines, from an input dataset that has been determined from combination datasets, assignment information assigning to each combination dataset a spin species shown therein, wherein the combination datasets in each case show magnetic resonance signals of a different spin species and were determined from at least two image datasets of a scan region of a patient that were acquired using an acquisition technique at different echo times in each case, by combination of the image datasets, wherein the trained function is embodied to use input data of the input dataset for determining output data that is used for determining the assignment information, characterized by the following steps:

providing training datasets, each of which comprises training input data and associated training output data describing the spin species assignment of the training input data, providing a pre-trained function, further training of at least one component of the pre-trained function, in particular at least one last layer of the pre-trained function, using the training datasets for determining the trained function, and providing the trained function.

Exemplary embodiment 14: A method according to exemplary embodiment 13, characterized in that the training input data is determined from real acquired magnetic resonance data of a patient population.

Exemplary embodiment 15: A method according to exemplary embodiment 14, characterized in that for at least a portion of the magnetic resonance data, the combination datasets are subjected to an image transformation, e.g. mirroring and/or shearing and/or rotation and/or a change in contrast, to generate further training datasets, and/or combination datasets assigned to different spin species are interchanged in order to generate further training datasets.

Exemplary embodiment 16: A method according to one of the exemplary embodiments 13 to 15, characterized in that an increasing proportion of the pre-trained function is trained further in a succession of multiple training steps.

Exemplary embodiment 17: A training system for providing a trained function for use as part of an assignment algorithm which determines, from an input dataset that has been determined from combination datasets, assignment information assigning to each combination dataset a spin species shown therein, wherein the combination datasets in each case show magnetic resonance signals of a different spin species and were determined from two image datasets of a scan region of a patient that were acquired using an acquisition technique at different echo times in each case, by combination of the image datasets, wherein the trained function is embodied to use input data of the input dataset for determining output data that is used for determining the assignment information, having:

a first training interface for providing training datasets, each of which comprises training input data and associated training output data describing the spin species assignment of the training input data, and for providing a pre-trained function, a training unit for further training of at least one component of the pre-trained function, in particular at least one last layer of the pre-trained function, using the training datasets for determining the trained function, and a second training interface for providing the trained function.

Exemplary embodiment 18: An evaluation system for evaluating magnetic resonance data of a scan region of a patient acquired by means of a magnetic resonance device, having:

a first interface for receiving at least two image datasets that were acquired using an acquisition technique at different echo times in each case, a combination unit for combining the image datasets into at least two combination datasets showing magnetic resonance signals of a different spin species in each case, a determination unit for determining an input dataset from the combination datasets, and an assignment unit for evaluating the input dataset by means of an assignment algorithm which comprises a trained function and which determines assignment information assigning to each combination dataset the spin species shown therein, characterized in that the assignment unit is embodied to use a pre-trained function trained further with regard to the spin species assignment by means of transfer learning as the trained function.

Exemplary embodiment 19: A magnetic resonance device having a control device embodied to perform a method according to one of the exemplary embodiments 1 to 12.

Exemplary embodiment 20: A computer program which performs the steps of a method according to one of the exemplary embodiments 1 to 16 when it is executed on a computing device, in particular a training system and/or a control device of a magnetic resonance device.

Exemplary embodiment 21: An electronically readable data medium on which a computer program according to exemplary embodiment 20 is stored.

In conclusion, an actual structure of a ResNet-18 that can be used as trained function 24 shall now be described by way of example:

```
Sequential(
  (0): Sequential(
    (0): Conv2d(3, 64, kernel_size=(7, 7), stride=(2, 2), padding=(3, 3), bias=False)
    (1): BatchNorm2d(64, eps=1e-05, momentum=0.1, affine=True, track_running_stats=True)
    (2): ReLU(inplace=True)
    (3): MaxPool2d(kernel_size=3, stride=2, padding=1, dilation=1, ceil_mode=False)
    (4): Sequential(
      (0): BasicBlock(
        (conv1): Conv2d(64, 64, kernel_size=(3, 3), stride=(1, 1), padding=(1, 1), bias=False)
        (bn1): BatchNorm2d(64, eps=1e-05, momentum=0.1, affine=True, track_running_stats=True)
        (relu): ReLU(inplace=True)
        (conv2): Conv2d(64, 64, kernel_size=(3, 3), stride=(1, 1), padding=(1, 1), bias=False)
        (bn2): BatchNorm2d(64, eps=1e-05, momentum=0.1, affine=True, track_running_stats=True)
      )
      (1): BasicBlock(
        (conv1): Conv2d(64, 64, kernel_size=(3, 3), stride=(1, 1), padding=(1, 1), bias=False)
        (bn1): BatchNorm2d(64, eps=1e-05, momentum=0.1, affine=True, track_running_stats=True)
        (relu): ReLU(inplace=True)
        (conv2): Conv2d(64, 64, kernel_size=(3, 3), stride=(1, 1), padding=(1, 1), bias=False)
        (bn2): BatchNorm2d(64, eps=1e-05, momentum=0.1, affine=True, track_running_stats=True)
      )
    )
    (5): Sequential(
      (0): BasicBlock(
        (conv1): Conv2d(64, 128, kernel_size=(3, 3), stride=(2, 2), padding=(1, 1), bias=False)
        (bn1): BatchNorm2d(128, eps=1e-05, momentum=0.1, affine=True, track_running_stats=True)
        (relu): ReLU(inplace=True)
        (conv2): Conv2d(128, 128, kernel_size=(3, 3), stride=(1, 1), padding=(1, 1), bias=False)
        (bn2): BatchNorm2d(128, eps=1e-05, momentum=0.1, affine=True, track_running_stats=True)
        (downsample): Sequential(
          (0): Conv2d(64, 128, kernel_size=(1, 1), stride=(2, 2), bias=False)
          (1): BatchNorm2d(128, eps=1e-05, momentum=0.1, affine=True, track_running_stats=True)
        )
      )
      (1): BasicBlock(
        (conv1): Conv2d(128, 128, kernel_size=(3, 3), stride=(1, 1), padding=(1, 1), bias=False)
        (bn1): BatchNorm2d(128, eps=1e-05, momentum=0.1, affine=True, track_running_stats=True)
        (relu): ReLU(inplace=True)
        (conv2): Conv2d(128, 128, kernel_size=(3, 3), stride=(1, 1), padding=(1, 1), bias=False)
        (bn2): BatchNorm2d(128, eps=1e-05, momentum=0.1, affine=True, track_running_stats=True)
      )
    )
    (6): Sequential(
      (0): BasicBlock(
        (conv1): Conv2d(128, 256, kernel_size=(3, 3), stride=(2, 2), padding=(1, 1), bias=False)
        (bn1): BatchNorm2d(256, eps=1e-05, momentum=0.1, affine=True, track_running_stats=True)
        (relu): ReLU(inplace=True)
        (conv2): Conv2d(256, 256, kernel_size=(3, 3), stride=(1, 1), padding=(1, 1), bias=False)
        (bn2): BatchNorm2d(256, eps=1e-05, momentum=0.1, affine=True, track_running_stats=True)
        (downsample): Sequential(
          (0): Conv2d(128, 256, kernel_size=(1, 1), stride=(2, 2), bias=False)
          (1): BatchNorm2d(256, eps=1e-05, momentum=0.1, affine=True, track_running_stats=True)
        )
      )
```

```
      (1): BasicBlock(
        (conv1): Conv2d(256, 256, kernel_size=(3, 3), stride=(1, 1), padding=(1, 1), bias=False)
        (bn1): BatchNorm2d(256, eps=1e-05, momentum=0.1, affine=True, track_running_stats=True)
        (relu): ReLU(inplace=True)
        (conv2): Conv2d(256, 256, kernel_size=(3, 3), stride=(1, 1), padding=(1, 1), bias=False)
        (bn2): BatchNorm2d(256, eps=1e-05, momentum=0.1, affine=True, track_running_stats=True)
      )
    )
    (7): Sequential(
      (0): BasicBlock(
        (conv1): Conv2d(256, 512, kernel_size=(3, 3), stride=(2, 2), padding=(1, 1), bias=False)
        (bn1): BatchNorm2d(512, eps=1e-05, momentum=0.1, affine=True, track_running_stats=True)
        (relu): ReLU(inplace=True)
        (conv2): Conv2d(512, 512, kernel_size=(3, 3), stride=(1, 1), padding=(1, 1), bias=False)
        (bn2): BatchNorm2d(512, eps=1e-05, momentum=0.1, affine=True, track_running_stats=True)
        (downsample): Sequential(
          (0): Conv2d(256, 512, kernel_size=(1, 1), stride=(2, 2), bias=False)
          (1): BatchNorm2d(512, eps=1e-05, momentum=0.1, affine=True, track_running_stats=True)
        )
      )
      (1): BasicBlock(
        (conv1): Conv2d(512, 512, kernel_size=(3, 3), stride=(1, 1), padding=(1, 1), bias=False)
        (bn1): BatchNorm2d(512, eps=1e-05, momentum=0.1, affine=True, track_running_stats=True)
        (relu): ReLU(inplace=True)
        (conv2): Conv2d(512, 512, kernel_size=(3, 3), stride=(1, 1), padding=(1, 1), bias=False)
        (bn2): BatchNorm2d(512, eps=1e-05, momentum=0.1, affine=True, track_running_stats=True)
      )
    )
  )
  (1): Sequential(
    (0): AdaptiveConcatPool2d(
      (ap): AdaptiveAvgPool2d(output_size=1)
      (mp): AdaptiveMaxPool2d(output_size=1)
    )
    (1): Flatten( )
    (2): BatchNorm1d(1024, eps=1e-05, momentum=0.1, affine=True, track_running_stats=True)
    (3): Dropout(p=0.25, inplace=False)
    (4): Linear(in_features=1024, out_features=512, bias=True)
    (5): ReLU(inplace=True)
    (6): BatchNorm1d(512, eps=1e-05, momentum=0.1, affine=True, track_running_stats=True)
    (7): Dropout(p=0.5, inplace=False)
    (8): Linear(in_features=512, out_features=1, bias=True)
  )
)
```

Although the disclosure has been illustrated and described in greater detail on the basis of the preferred exemplary embodiment, the disclosure is not limited by the disclosed examples and other variations can be derived herefrom by the person skilled in the art without leaving the scope of protection of the disclosure.

What is claimed is:

1. A computer-implemented method for evaluating magnetic resonance data of a scan region of a patient, comprising:
    acquiring, via a magnetic resonance device, two image datasets identified with the scan region of the patient, the two image datasets being acquired using different echo times,
    generating, based upon the two image datasets, two combination datasets, each one of the two combination datasets being associated with magnetic resonance signals of a different spin species; and
    assigning a spin species to each of the two combination datasets by:
        determining an input dataset based upon the two combination datasets; and
        evaluating the input dataset via an assignment algorithm that is trained in accordance with a trained function to determine assignment information by assigning, to each of the two combination datasets, a respective spin species,
    wherein the trained function comprises a pre-trained function that is trained with respect to spin species assignment via transfer learning.

2. The method as claimed in claim 1, wherein the respective spin species comprise one of spins of protons bound to fat and spins of protons bound to water, and wherein the two combination datasets are generated via execution of a Dixon algorithm that is configured to compensate for deviations from assumed phase relationships between each one of the respective spin species due to interference effects during acquisition of the two image datasets.

3. The method as claimed in claim 1, wherein the act of determining the input dataset comprises:

downscaling the two combination datasets to a lower resolution by more than 50%.

4. The method as claimed in claim 1, wherein each of the two combination datasets comprises a plurality of image slices, and wherein the act of determining the input dataset comprises:

downscaling each one of the plurality of image slices in the two combination datasets to a square shape having a size ranging between (48 to 256 pixels) by (48 to 256 pixels).

5. The method as claimed in claim 1, wherein each of the two combination datasets comprises a plurality of image slices, and wherein the act of determining the input dataset comprises:

downscaling the two combination datasets to provide two downscaled combination datasets; and normalizing the two combination datasets, the normalization being performed independently for each one of the plurality of image slices and for each of the two downscaled combination datasets.

6. The method as claimed in claim 1, wherein each of the two combination datasets comprises a plurality of image slices, and wherein the act of determining the input dataset comprises:

consolidating slice images from among the two combination datasets that are identified with the same acquired slice to generate a multi-channel input data image.

7. The method as claimed in claim 6, wherein the multi-channel input data image comprises red-green-blue (RGB) channels, and wherein, when a number of the two combination datasets is less than the RGB channels, one of the RGB channels is used to provide a combination image formed from a linear combination of the plurality of image slices images of the two combination datasets.

8. The method as claimed in claim 6, wherein the trained function is additionally applied to input data in which an assignment of combination datasets to respective channels from among the multi-channel input data image is transposed, and wherein results of the trained function are incorporated into the assignment information.

9. The method of claim 6, wherein the slice images from among the combination datasets that are identified with the same acquired slice that are consolidated to generate the multi-channel input data image comprise downscaled slice images.

10. The method of claim 6, wherein:

slice images from among a first one of the two combination datasets that are identified with the same acquired slice are assigned to a first one of the RGB channels, slice images from among a second one of the two combination datasets that are identified with the same acquired slice are assigned to a second one of the RGB channels, the combination image formed from the linear combination of the plurality of image slices is assigned to a third one of the RGB channels, and the linear combination of the plurality of image slices that form the combination image represents an addition or a subtraction of the plurality of image slices in the first and the second channels.

11. The method as claimed in claim 1, wherein the act of determining the input dataset comprises:

filtering out slice images associated with the two combination datasets based upon a noise and/or intensity filter criterion.

12. The method as claimed in claim 11, wherein the act of filtering out the slice images associated with two combination datasets comprises:

separating out slice images having an average and/or maximum image element value that is less than a threshold value, wherein the threshold value is selected as a function of an average and/or maximum image element value, respectively, occurring over an entirety of the slice images associated with the two combination datasets.

13. The method as claimed in claim 1, wherein:

each of the two combination datasets comprises a plurality of image slices, the trained function is applied slice-by-slice to each one of the plurality of images associated with the two combination datasets, and the assignment information is determined from results from different ones of the plurality of image slices on the basis of a majority vote.

14. The method of claim 13, wherein the assignment information is determined via the trained function providing output data regarding a spin species assignment for each one of the plurality of image slices, and providing the input dataset based on a majority vote of the spin species assignment of each one of the plurality of image slices.

15. The method as claimed in claim 1, wherein the trained function comprises a convolutional neural network.

16. The method as claimed in claim 15, wherein the convolutional neural network comprises a ResNet-18 network, a ResNet-34 network, a SqueezeNet network, an AlexNet network, or a VGG network.

17. The method as claimed in claim 1, wherein the respective spin species comprise a first and a second spin species, and wherein the trained function returns a regression value between zero and one, wherein a value of zero corresponds to an assignment of the first spin species to a defined one of the two combination datasets, and wherein a value of one corresponds to an assignment of the second spin species to the defined one of the two combination datasets.

18. The method of claim 17, wherein the transfer function is trained with respect to spin species assignment via transfer learning by replacing an originally output classifier with a new classifier to return the regression value between zero and one.

19. A magnetic resonance device, for evaluating magnetic resonance data of a scan region of a patient, comprising:
- a main magnet; and
- control circuitry configured to:
  - acquire two image datasets identified with the scan region of the patient, the two image datasets being acquired using different echo times,
  - generate, based upon the two image datasets, a least two combination datasets, each one of the two combination datasets being associated with magnetic resonance signals of a different spin species; and
- assign a spin species to each of the two combination datasets by:
  - determining an input dataset based upon the two combination datasets; and
  - evaluating the input dataset via an assignment algorithm that is trained in accordance with a trained function to determine assignment information by assigning, to each of the two combination datasets, a respective spin species,
- wherein the trained function comprises a pre-trained function that is trained with respect to spin species assignment via transfer learning.

20. A non-transitory computer readable medium having instructions stored thereon that, when executed by one or more processors of a magnetic resonance device, cause the magnetic resonance device to evaluate magnetic resonance data of a scan region of a patient by:
- acquiring two image datasets identified with the scan region of the patient, the two image datasets being acquired using different echo times;
- generating, based upon the two image datasets, two combination datasets, each one of the two combination datasets being associated with magnetic resonance signals of a different spin species; and
- assigning a spin species to each of the two combination datasets by:
  - determining an input dataset based upon the two combination datasets; and
  - evaluating the input dataset via an assignment algorithm that is trained in accordance with a trained function to determine assignment information by assigning, to each of the two combination datasets, a respective spin species,
- wherein the trained function comprises a pre-trained function that is trained with respect to spin species assignment via transfer learning.

* * * * *